United States Patent
McKee

(10) Patent No.: US 7,683,306 B2
(45) Date of Patent: Mar. 23, 2010

(54) DUAL CONVERSION GAIN GATE AND CAPACITOR COMBINATION

(75) Inventor: Jeffrey A. McKee, Meridian, ID (US)

(73) Assignee: Micron Technology Inc., Boise, ID (US)

( * ) Notice: Subject to any disclaimer, the term of this patent is extended or adjusted under 35 U.S.C. 154(b) by 7 days.

(21) Appl. No.: 12/230,014

(22) Filed: Aug. 21, 2008

(65) Prior Publication Data

US 2008/0315261 A1     Dec. 25, 2008

Related U.S. Application Data

(62) Division of application No. 11/193,322, filed on Aug. 1, 2005, now Pat. No. 7,432,540.

(51) Int. Cl.
*H01L 29/72*     (2006.01)
(52) U.S. Cl. ................. 250/208.1; 348/308; 438/57; 438/73; 438/378; 257/292
(58) Field of Classification Search ............... 257/225, 257/292, 462; 250/208.1; 348/308; 438/57, 438/73, 378
See application file for complete search history.

(56) References Cited

U.S. PATENT DOCUMENTS

| | | | |
|---|---|---|---|
| 5,955,753 A | 9/1999 | Takahashi | |
| 6,107,655 A | 8/2000 | Guidash | |
| 6,140,630 A | 10/2000 | Rhodes | |
| 6,160,281 A | 12/2000 | Guidash | |
| 6,204,524 B1 | 3/2001 | Rhodes | |
| 6,218,656 B1 | 4/2001 | Guidash | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,352,869 B1 | 3/2002 | Guidash | |
| 6,423,994 B1 | 7/2002 | Guidash | |
| 6,552,323 B2 | 4/2003 | Guidash et al. | |
| 6,657,665 B1 | 12/2003 | Guidash | |
| 6,947,088 B2 | 9/2005 | Kochi | |
| 2004/0251394 A1 * | 12/2004 | Rhodes et al. | ........... 250/208.1 |
| 2005/0167574 A1 | 8/2005 | He et al. | |

OTHER PUBLICATIONS

Written Opinion of the International Searching Authority, Feb. 5, 2008.

* cited by examiner

*Primary Examiner*—Edward Wojciechowicz
(74) *Attorney, Agent, or Firm*—Dickstein Shapiro LLP

(57) ABSTRACT

A pixel cell array architecture having a dual conversion gain. A dual conversion gain element is coupled between a floating diffusion region and a respective storage capacitor. The dual conversion gain element having a control gate switches in the capacitance of the capacitor to change the conversion gain of the floating diffusion region from a first conversion gain to a second conversion gain. In order to increase the efficient use of space, the dual conversion gain element gate also functions as the bottom plate of the capacitor. In one particular embodiment of the invention, a high dynamic range transistor is used in conjunction with a pixel cell having a capacitor-DCG gate combination; in another embodiment, adjacent pixels share pixel components, including the capacitor-DCG combination.

11 Claims, 10 Drawing Sheets

DUAL CONVERSION GAIN GATE AND CAPACITOR COMBINATION

This is a divisional application of U.S. patent application Ser. No. 11/193,322, filed on Aug. 1, 2005 now U.S. Pat. No. 7,432,540, the disclosure of which is incorporated by reference in its entirety.

FIELD OF THE INVENTION

The present invention relates generally to digital image sensors and in particular to dual conversion gain imagers.

BACKGROUND OF THE INVENTION

Imaging devices, including charge coupled devices (CCD) and complementary metal oxide semiconductor (CMOS) imagers, are commonly used in photo-imaging applications.

Typically, a digital imager array includes a focal plane array of pixel cells, each one of the cells including a photosensor, e.g., a photogate, photoconductor, or a photodiode. In a CMOS imager a readout circuit is connected to each pixel cell which typically includes a source follower output transistor. The photosensor converts photons to electrons which are typically transferred to a storage node, e.g., a floating diffusion region connected to the gate of the source follower output transistor. A charge transfer device (e.g., transistor) can be included for transferring charge from the photosensor to the floating diffusion region. In addition, such imager cells typically have a transistor for resetting the storage node to a predetermined charge level prior to charge transference. The output of the source follower transistor is gated as a pixel output signal by a row select transistor.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, each of which are assigned to Micron Technology, Inc. The disclosures of each of the forgoing are hereby incorporated by reference herein in their entirety.

With reference to FIGS. 1 and 2, which respectively illustrate a top-down and a cross-sectional view of a conventional CMOS pixel cell 100, when incident light 187 strikes the surface of a photodiode photosensor 120, electron/hole pairs are generated in the p-n junction of the photodiode photosensor 120 (represented at the boundary of n– accumulation region 122 and p+ surface layer 123). The generated electrons (photo-charges) are collected in the n-type accumulation region 122 of the photosensor 120. The photo-charges move from the initial charge accumulation region 122 to a floating diffusion region 110 via a transfer transistor 106. The charge at the floating diffusion region 110 is typically converted to a pixel output voltage by a source follower transistor 108 and subsequently output on a column output line 111 via a row select transistor 109.

Conventional CMOS imager designs, such as the one shown in FIG. 1 for pixel cell 100, provide approximately a fifty percent fill factor, meaning only half of the cell 100 is dedicated to converting light to charge carriers. As shown, only a small portion of the cell 100 comprises a photosensor 120 (e.g., photodiode). The remainder of the pixel cell 100 includes isolation regions 102, shown as STI regions in a substrate 101, the floating diffusion region 110 coupled to a transfer gate 106' of the transfer transistor 106, and source/drain regions 115 for reset 107, source follower 108, and row select 109 transistors having respective gates 107', 108', and 109'. In the conventional pixel cell 100 layout, each of the reset, source follower and row select transistor gates 107', 108' and 109' are aligned consecutively, sharing source/drain regions 115 and requiring significant surface area for each pixel cell 100. As scaling of pixels continues to decrease the pixel's 100 total area, it becomes increasingly important to create high sensitivity photosensors that utilize a minimum amount of surface area, or to find more efficient pixel cell layouts to minimize the area required by non-photosensitive components of the pixel cell in order to maintain relatively large areas for the photosensors.

In addition, conventional storage nodes, such as floating diffusion region 110, have a limited amount of charge storage capacity. Once this capacity is reached, a pixel cell becomes less efficient. Specifically, the full dynamic range available for the pixel cell cannot be utilized. Once the charge storage capacity is exceeded, an undesirable phenomenon, known as "blooming" occurs, whereby the "over-capacity" charges escape to undesirable parts of the pixel cell 100 or to adjacent pixel cells. One suggested solution for dealing with this limited charge storage capacity is to add a capacitor which is connected to the floating diffusion region 110. The capacitor is used to store the additional over-capacity charges so the charges do not flow to other areas of the cell or adjacent cells. The problem with this solution, however, is that the additional capacitor takes up space in the cell that could otherwise be used to increase the size of the cell's photosensor, thereby decreasing the potential fill factor for the pixel cells and overall array.

Accordingly, there is a need and desire to increase the fill factor and storage capacity of imager pixel cells. Thereby, the dual conversion gain gates of the invention provide good sensitivity at low and high light conditions.

BRIEF SUMMARY OF THE INVENTION

The present invention, in the various exemplary embodiments, provides a pixel cell array architecture having a dual conversion gain. A dual conversion gain element is coupled between a floating diffusion region and a respective storage capacitor. The dual conversion gain element having a control gate switches in the capacitance of the capacitor to change the conversion gain of the floating diffusion region from a first conversion gain to a second conversion gain. In order to increase the efficient use of space, the dual conversion gain element gate also functions as the bottom plate of the capacitor.

In one particular embodiment of the invention, a high dynamic range transistor is used in conjunction with a pixel cell having a capacitor-DCG gate combination; in another embodiment, adjacent pixels share pixel components, including the capacitor-DCG combination.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
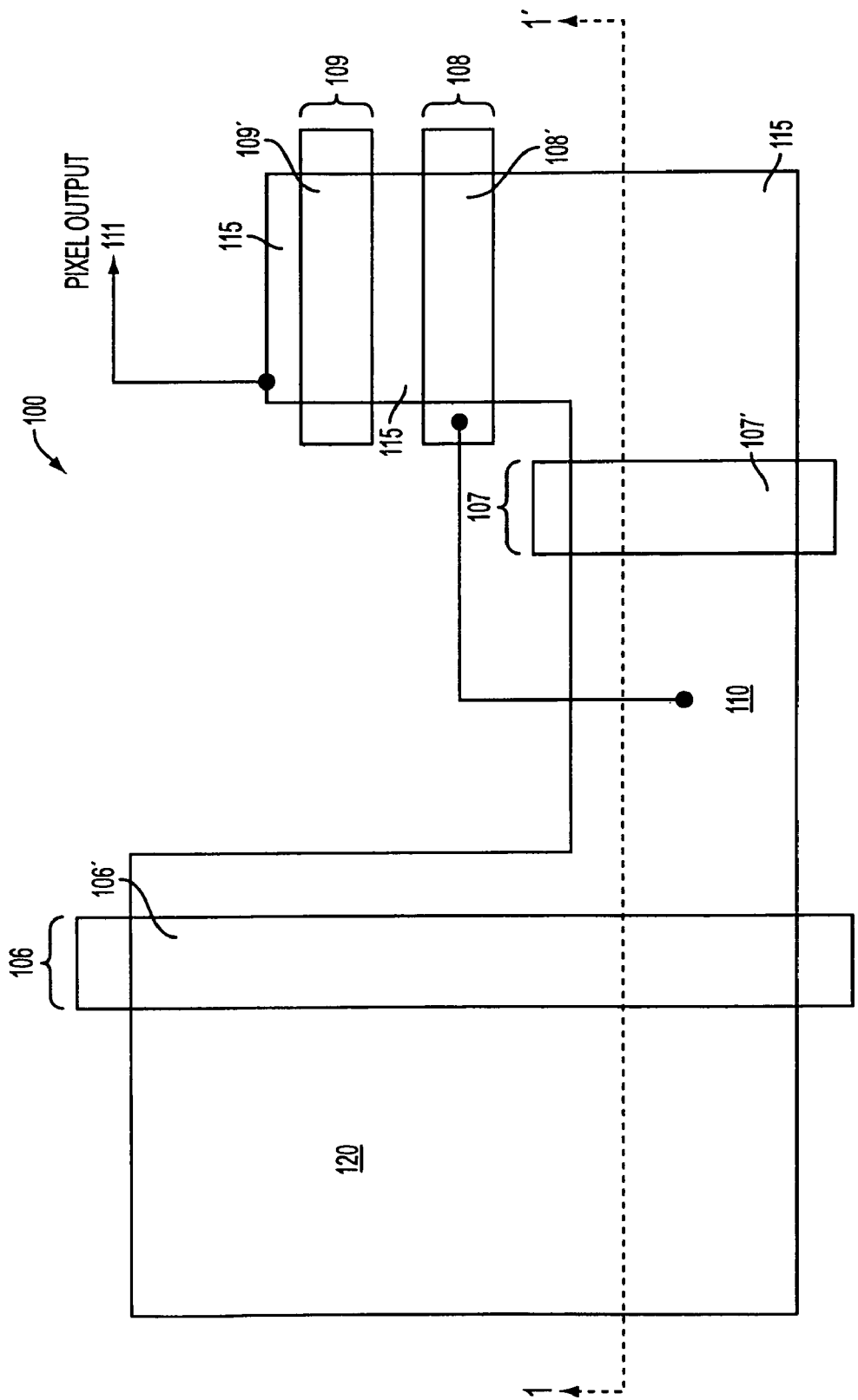
FIG. 1 is a top-down view of a conventional CMOS pixel cell.
Figure 2:
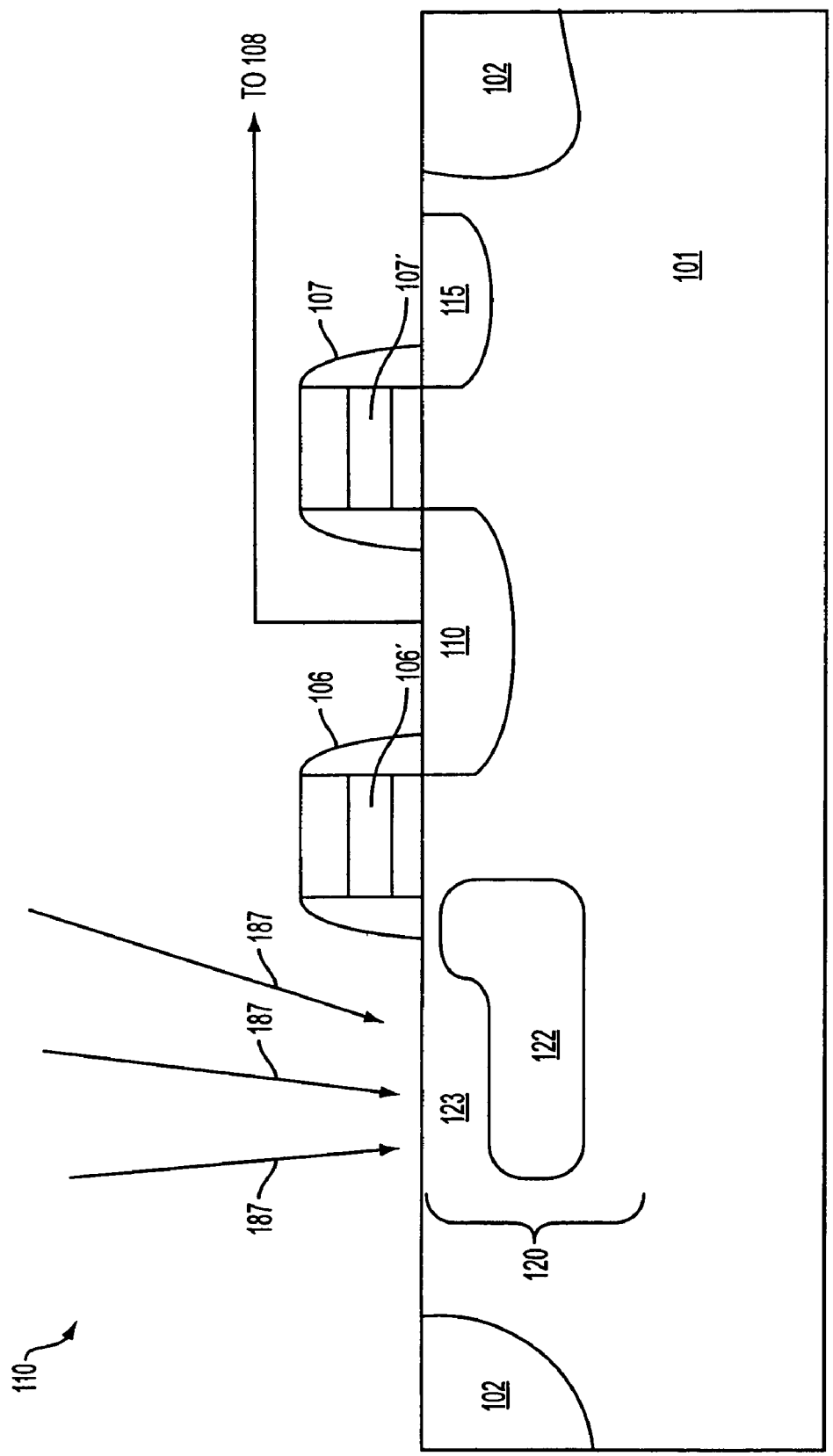
FIG. 2 is a cross-sectional view of the pixel cell of FIG. 1, taken along line 1-1'.

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, epitaxial, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor and associated transistors for converting photons to an electrical signal. For purposes of illustration, a small number of representative pixel cells are illustrated in the figures and description herein; however, typically fabrication of a large plurality of like pixel cells proceeds simultaneously. Accordingly, the following detailed description is not to be taken in a limiting sense, and the scope of the present invention is defined only by the appended claims.

The terms "at an angle," "angled," and "slanted," as used herein are to be interpreted as meaning at any angle, with respect to some stated reference point, that is not exactly parallel or exactly perpendicular. Accordingly, when a portion of an object and some reference point meet to form an angle that is not 0°, 90°, or 180°, the object is considered "angled," "at an angle," or "slanted" with respect to the reference point.

The invention generally relates to a dual conversion gain element gate functioning as the bottom plate of a storage capacitor in a pixel cell. The capacitor serves to increase the charge capacity of the pixel cell when needed. The dual conversion gain (DCG) gate improves the light performance while providing a wide dynamic range for the pixel cells. The inventive combination provides an efficient pixel array architecture that increases the fill factor of pixel cells in the array. In one particular embodiment of the invention, a high dynamic range transistor (HDR) is used in conjunction with a pixel cell having a capacitor-DCG gate combination; in another embodiment, adjacent pixels share pixel components, including the capacitor-DCG combination.

Figure 3:
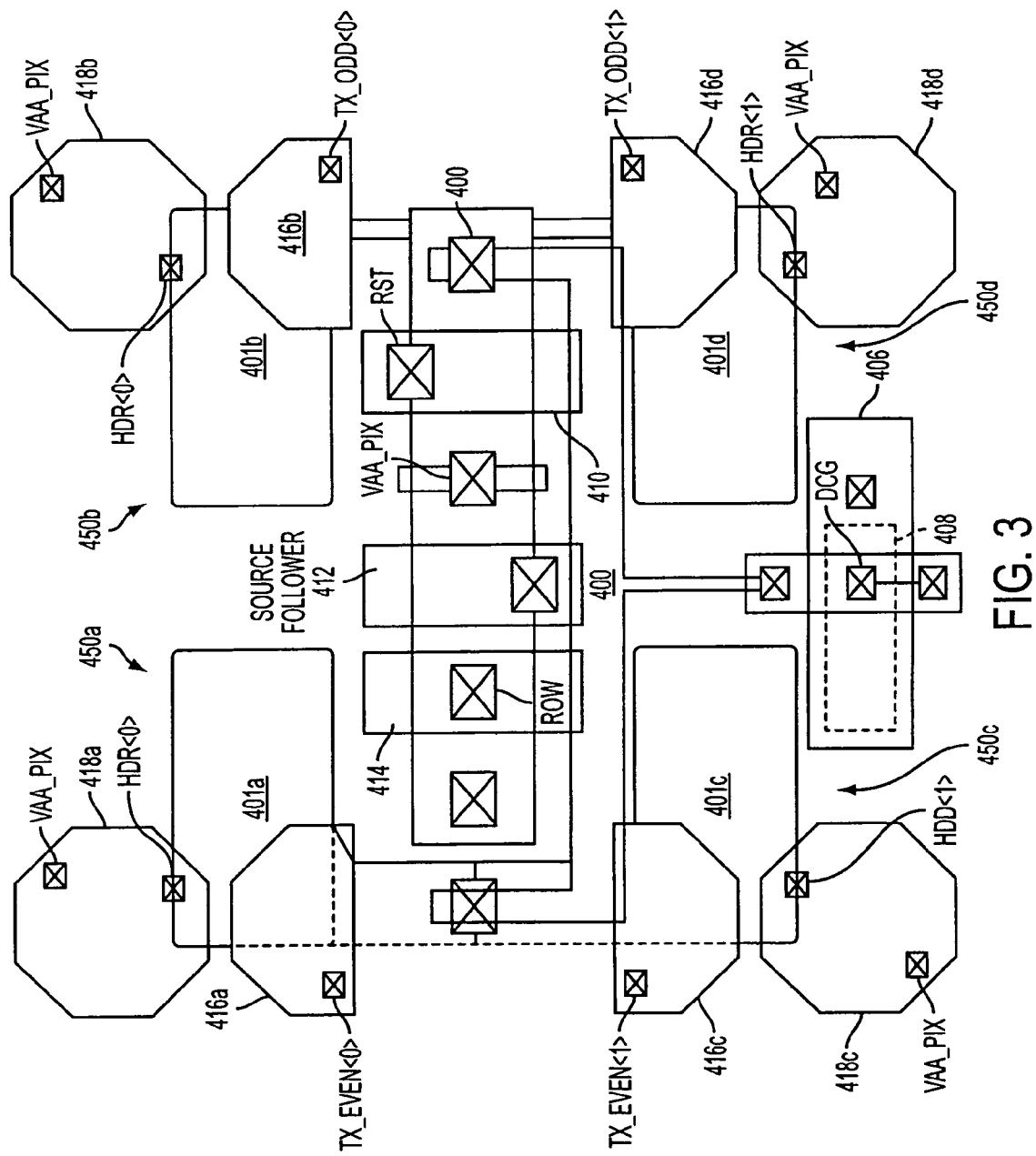
FIG. 3 is a top-down view of a portion of a CMOS pixel cell array constructed in accordance with an exemplary embodiment of the invention.
Figure 4:
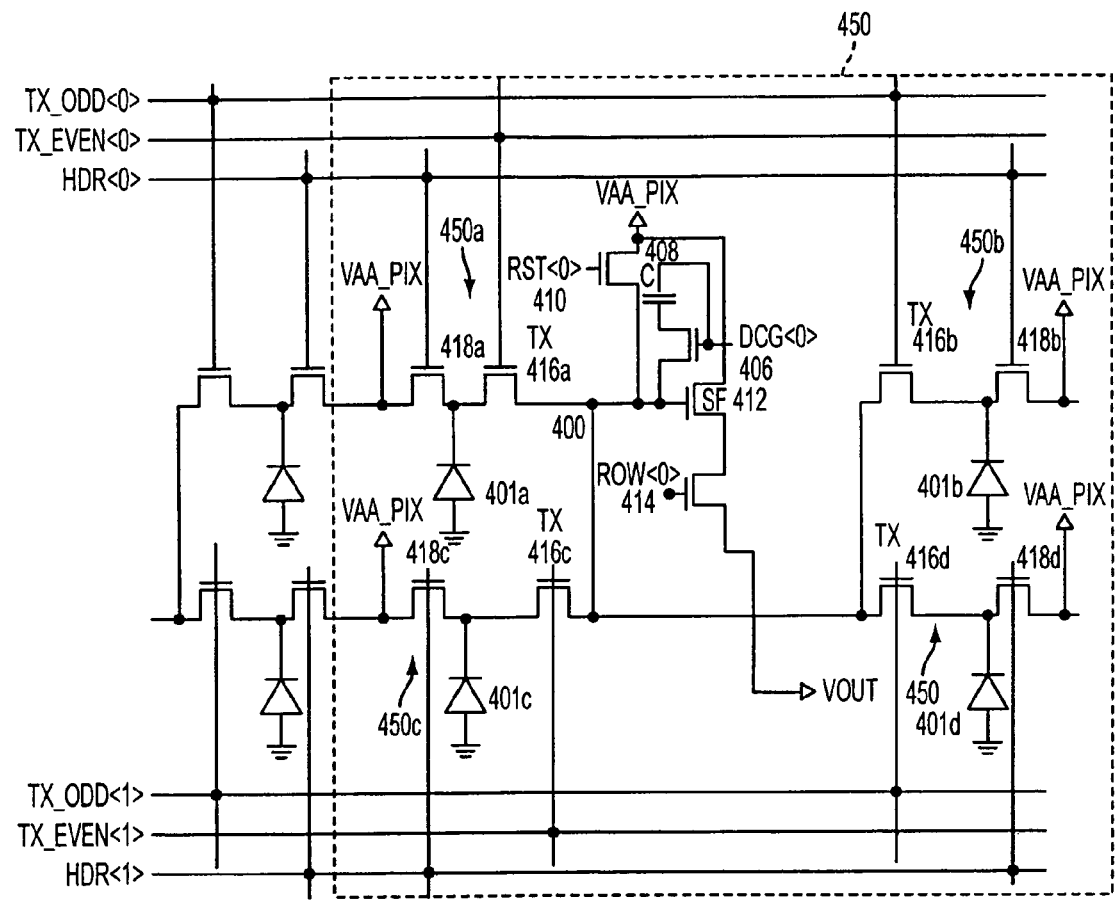
FIG. 4 is a circuit diagram of the exemplary embodiment depicted in FIG. 3.

Referring to FIGS. 3-4, one exemplary embodiment of the combined capacitor-dual conversion gain element gate is illustrated in connection with a 4-way shared pixel circuit 450. A top down view of a substrate containing the pixel circuit 450 is illustrated in FIG. 3. A circuit diagram of the pixel cell 450 of FIG. 3 is illustrated in FIG. 4. As shown in FIG. 4, the pixel circuit 450 comprises portions of four pixel cells 450a, 450b, 450c, 450d. The illustrated shared pixel circuit 450 also includes a shared dual conversion gain (DCG) transistor 406, capacitor 408, reset transistor 410, source follower transistor 412, row select transistor 414, and floating diffusion region 400. As discussed below in more detail, the gate of the DCG transistor 406 also serves as one plate of the capacitor 408.

The first pixel cell 450a includes a first photosensor 401a (illustrated as a photodiode), and a first charge transfer transistor 416a. A first high dynamic range (HDR) transistor 418a may be part of the pixel cell 450a if desired. The first HDR transistor 418a is connected between the photosensor 401a and a pixel supply voltage VAA_PIX. The gate terminal of the HDR transistor 418a, if used, is connected to receive a first row high dynamic range control signal HDR <0>. When the control signal HDR <0> is received, the HDR transistor 418a allows for some charge to be drained away from the photosensor 401a.

The first transfer transistor 416a is connected between the first photosensor 401a and a shared floating diffusion region 400 and is controllable by a first row even transfer gate control signal TX_EVEN<0>. When the first even transfer gate control signal TX_EVEN<0> is generated, the first transfer transistor 416a is activated which allows charge from the first photosensor 401a to flow to the floating diffusion region 400.

The second pixel cell 450b includes a second photosensor 401b (illustrated as a photodiode), and a second transfer transistor 416b. A second HDR transistor 418b may be part of the pixel cell 450b if desired. The HDR transistor 418b is connected between the photosensor 401b and the pixel supply voltage VAA_PIX. The gate terminal of the HDR transistor 418b is connected to receive the first row high dynamic range control signal HDR <0>. When the control signal HDR <0> is received, the transistor 418b allows some charge to be drained away from the photosensor 401b.

The second transfer transistor is 416b is connected between the second photosensor 401b and the shared floating diffusion region 400 and is controllable by a first row odd transfer gate control signal TX_ODD<0>. When the first row odd transfer gate control signal TX_ODD<0> is generated, the second transfer transistor 416b is activated which allows charge from the second photosensor 401b to flow to the floating diffusion region 400.

The third pixel cell 450c includes a third photosensor 401c (illustrated as a photodiode), and a third transfer transistor 416c. A third HDR transistor 418c may be part of the pixel cell 450c if desired. The HDR transistor 418c is connected between the photosensor 401c and the pixel supply voltage VAA_PIX. The gate terminal of the third HDR transistor 418c is connected to receive a second row high dynamic range control signal HDR <1>. When the control signal HDR <1> is received, the transistor 418c allows for some charge to be drained away from the photosensor 401c.

The third transfer transistor is 416c is connected between the third photosensor 401c and the shared floating diffusion region 400 and is controllable by a second row even row transfer gate control signal TX_EVEN<1>. When the second row even transfer gate control signal TX_EVEN<1> is generated, the third transfer transistor 416c is activated which allows charge from the third photosensor 401c to flow to the floating diffusion region 400.

The fourth pixel cell 450d includes a fourth photosensor 401d (illustrated as a photodiode), and a fourth transfer transistor 416d. A fourth HDR transistor 418d may be part of the pixel cell 401d if desired. The fourth HDR transistor 418d is connected between the photosensor 401d and the pixel supply voltage VAA_PIX. The gate terminal of the fourth HDR transistor 418d is connected to receive a second row high dynamic range control signal HDR <1>. When the control signal HDR <1> is received, the transistor allows for some charge to be drained away from the photosensor 401d.

The fourth transfer transistor is 416d is connected between the four photosensor 401d and the shared floating diffusion region 400 and is controllable by a second odd transfer gate control signal TX_ODD<1>. When the second odd transfer gate control signal TX_ODD<1> is generated, the fourth transfer transistor 416d is activated which allows charge from the fourth photosensor 401d to flow to the floating diffusion region 400.

The capacitor-DCG gate combination 408, 406 is shared by all four pixel cells 450a, 450b, 450c, 450d. The capacitor 408 receives a supply voltage from the DCG gate voltage. The floating diffusion region 400 is connected to the drain of the DCG transistor 406. The source of the DCG transistor 406 is connected to the plate of the capacitor 408. The four photosensors 401a, 401b, 401c, 401d each share a gate of the transfer transistor 416a, 416b, 416c, 416d with adjacent pixels, however, each photosensor 401a, 401b, 401c, 401d has its own transfer transistor 416a, 416b, 416c, 416d. A source/drain terminal of the source follower transistor is connected to the array pixel supply voltage VAA_PIX. The row select transistor 414 is connected between the source follower transistor 412 and a column line. Each of the HDR transistors 418a, 418b, 418c, 418d share a drain contact. It should be noted that the HDR transistors 418a, 418b, 418c, 418d are optional components that are not necessary to practice the invention.

One advantage of the capacitor-DCG gate combination 408, 406 is its efficient use of space. As noted above, the DCG gate functions 406 as the bottom plate of the capacitor 408, which reduces the need for fabricating two plates for the capacitor 408.

The reset transistor 410 is connected between array pixel supply voltage VAA_PIX and the floating diffusion region 400. The capacitor 408 is connected between the gate terminal of the DCG transistor 406 and the source of the DCG transistor 406. The DCG transistor 406 has the gate connected to a dual conversion gain control signal DCG. When the dual conversion gain signal DCG is generated, the DCG transistor 406 is activated, which connects the storage capacitance of the capacitor 408 to the floating diffusion region 400. This increases the storage capability of the floating diffusion region 400, which is desirable and mitigates floating diffusion leakage problems. As set forth above, the pixels cells 450a, 450b, 450c, 450d share the source follower transistor 412, reset transistor 410, and row select transistor 414. Each transfer gate 416a, 416b, 416c, 416d transfers charge to the shared floating diffusion 400 region independently of the other photosensors 401a, 401b, 401c, 401d. This shared pixel cell 450 arrangement allows for each photosensor 401a, 401b, 401c, 401d to remain large due to the sharing of pixel components 400, 414, 410, 412, 418 and the combined DCG gate and capacitor plate.

In the exemplary embodiment described above, at least a portion of the transfer gate 416 (FIG. 3) has an angled edge with respect to the photosensors 401a, 401b, 401c, 401d. For example, with reference to FIG. 3, the sides of the transfer gates 416a, 416b, 416c, 416d are shown as being slanted, which allows for a larger photosensor 401a, 401b, 401c, 401d. This angled geometry of the transfer gates 416a, 416b, 416c, 416d allows for an efficient layout of the transfer gates. In addition, this angled layout is also beneficial in maximizing the fill factor of the pixel cell 450, by maximizing the area of the photosensor 401a, 401b, 401c, 401d for each pixel cell 450a, 450b, 450c, 450d.

Figure 5:
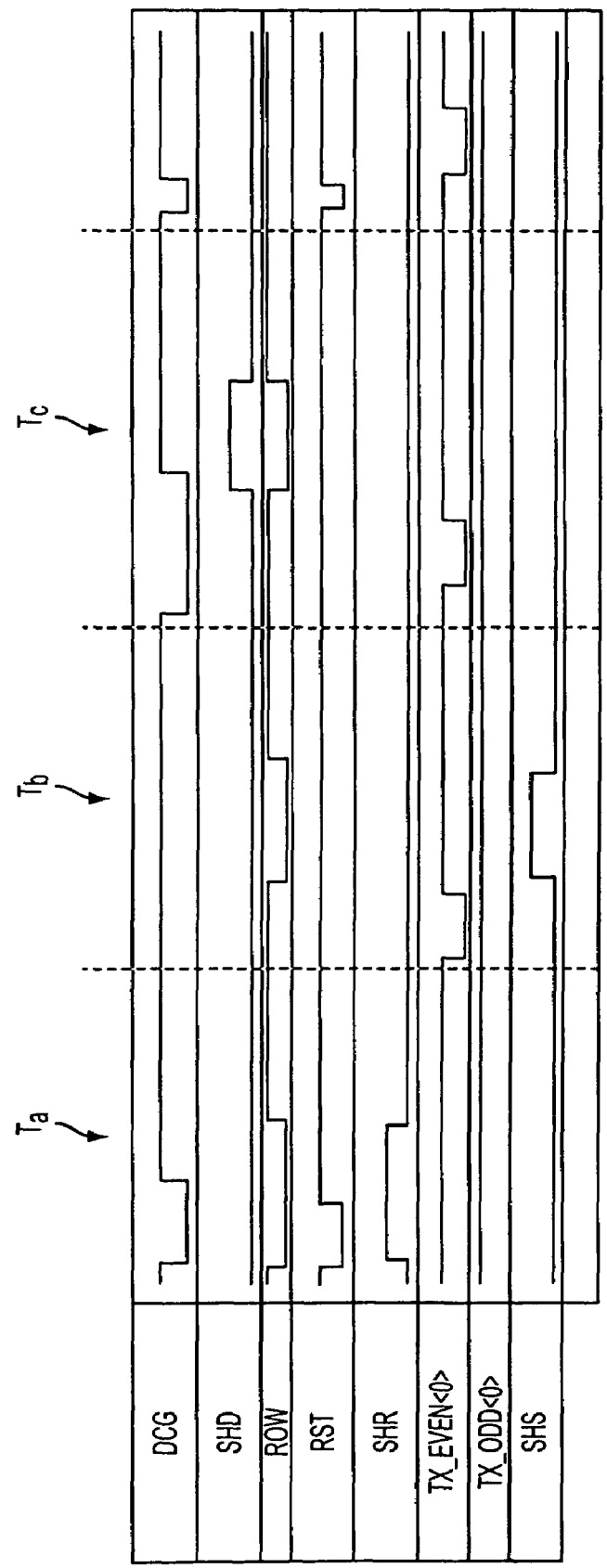
FIG. 5 is a timing diagram of the operation of the pixel cell array of FIG. 3 according to an exemplary embodiment of the invention.

FIG. 5 is a timing diagram illustrating one exemplary operation of a portion of the four-way pixel cell 450 illustrated in FIGS. 3-4. For clarity purposes only, the timing diagram illustrates the operation of the of the first pixel cell 450a. It should be noted that the operation of the circuit 450 would repeat the following steps for the operation for pixel cells 450b, 450c, 450d. Since the operation of the remaining pixels cells 450b, 450c, 450d is essentially the same (with the below noted exceptions), a detailed description of the operation of pixels 450b, 450c, 450d is not provided. FIG. 5 illustrates the row select signal ROW as being toggled high and low at certain instances. This control signal is active on low. It should be appreciated that the row select signal ROW could remain applied during all three time periods $T_a$, $T_b$, $T_c$, if desired.

The timing diagram illustrates three periods $T_a$, $T_b$, $T_c$. During the first time period $T_a$, the row select signal ROW is applied to the gate of the row select transistor 414 (shown as being active low in FIG. 5). It should be appreciated that FIG. 5 is an exemplary timing diagram and that it is immaterial whether a signal is illustrated as being active low or high in FIG. 5. All that is required to practice the invention is for the illustrated signal to activate the component the signal is controlling.

While the row select transistor is 414 is on, the floating diffusion region 400 of the pixel circuit 450 is reset by asserting the reset control signal RST (shown as being active low in FIG. 5). This causes the array pixel supply voltage VAA_PIX to be applied to the floating diffusion region 400 (through the reset transistor 410). The DCG gate voltage is applied to the capacitor 408 by activating the DCG transistor 406 (pulsing of DCG). The reset signal voltage Vrst associated with the reset floating diffusion region 400 (as output by the source follower transistor 412 and activated row select transistor 414) is applied to a column line connected to sample and hold circuitry 265 (FIG. 9) and then sampled and held, for the first pixel cell 450a, by the pulsing of a reset sample and hold signal SHR.

During the second time period $T_b$, charge accumulating in the first photosensor 450a is transferred to the floating diffusion region 400 when the first even transfer gate control signal TX_EVEN<0> is asserted (shown as being active low in FIG. 5) and activates the first transfer transistor 416a. The pixel signal voltage Vsig1 associated with the first pixel cell's 450a pixel signal charge stored in the floating diffusion region 400, as output by the source follower transistor 412 and activated row select transistor 414, is applied to a column line connected to sample and hold circuitry 265 (FIG. 9) and then sampled and held by the pulsing of a sample and hold pixel signal SHS.

To increase the charge storage capacity of the pixel cell 450a, the following operations are performed during the third time period $T_c$. It should be noted that the following third time period $T_c$ operations may be performed for every readout operation or only when needed to avoid the over capacity condition described above (i.e., when a controller or image processor determines that the amount of incident light will result in the floating diffusion region 400 being saturated).

During the third time period $T_c$, the dual conversion gain control signal DCG is applied (shown as being active low in FIG. 5). This causes the DCG transistor 406 to become active, which connects the floating diffusion region 400 to the capacitor 408. The charge within the floating diffusion region 400 also flows to and is stored in the capacitor 408. The first even transfer gate control signal TX_EVEN<0> is applied (shown as being active low in FIG. 5) to activate the first transfer transistor 416a. The remaining excess charge from the first photosensor 401a is stored in the floating diffusion region 400. The new pixel signal voltage Vsig2 associated with the excess pixel signal charge stored in the floating diffusion region 400, as output by the source follower transistor 412 and activated row select transistor 414, is applied to a column line connected to sample and hold circuitry 265 (FIG. 9) and then sampled and held for the first pixel cell 450a by the pulsing of a third sample and hold pixel signal (active high) SHD. The three sampled and held signals for pixel 450a may then undergo a correlated sampling operation to obtain the actual pixel signal level for each conversion gain (e.g., Vrst-Vsig1 and Vrst-Vsig2). These signals may both be converted to digital signals and sent to the image processor 280 discussed below, or only one of the two signals is selected, converted and sent to the image processor 280.

The operations are then repeated for the remaining pixels 450b, 450c, 450d. It should be noted that for the remaining pixels 450b, 450c, 450d, the same operations would occur except that the transfer gates 416b, 416c, 416d are controlled by the transfer gate control signals TX_EVEN<1>, TX_ODD<0>, TX_ODD<1>, respectively.

It should be noted that if HDR transistors 418a, 418b, 418c, 418d are used in the pixel circuit 450, then the high dynamic range control signals HDR<0>, HDR<1>, for the first and second pixel rows respectively, would be applied throughout all three time periods $T_a$, $T_b$, $T_c$ to ensure that the HDR transistors 418a, 418b, 418c, 418d remain active during the readout operations. This prevents blooming and other phenomena from occurring during the readout process by draining some charge away from the photosensors 401a, 401b, 401c, 401d.

Figure 6:
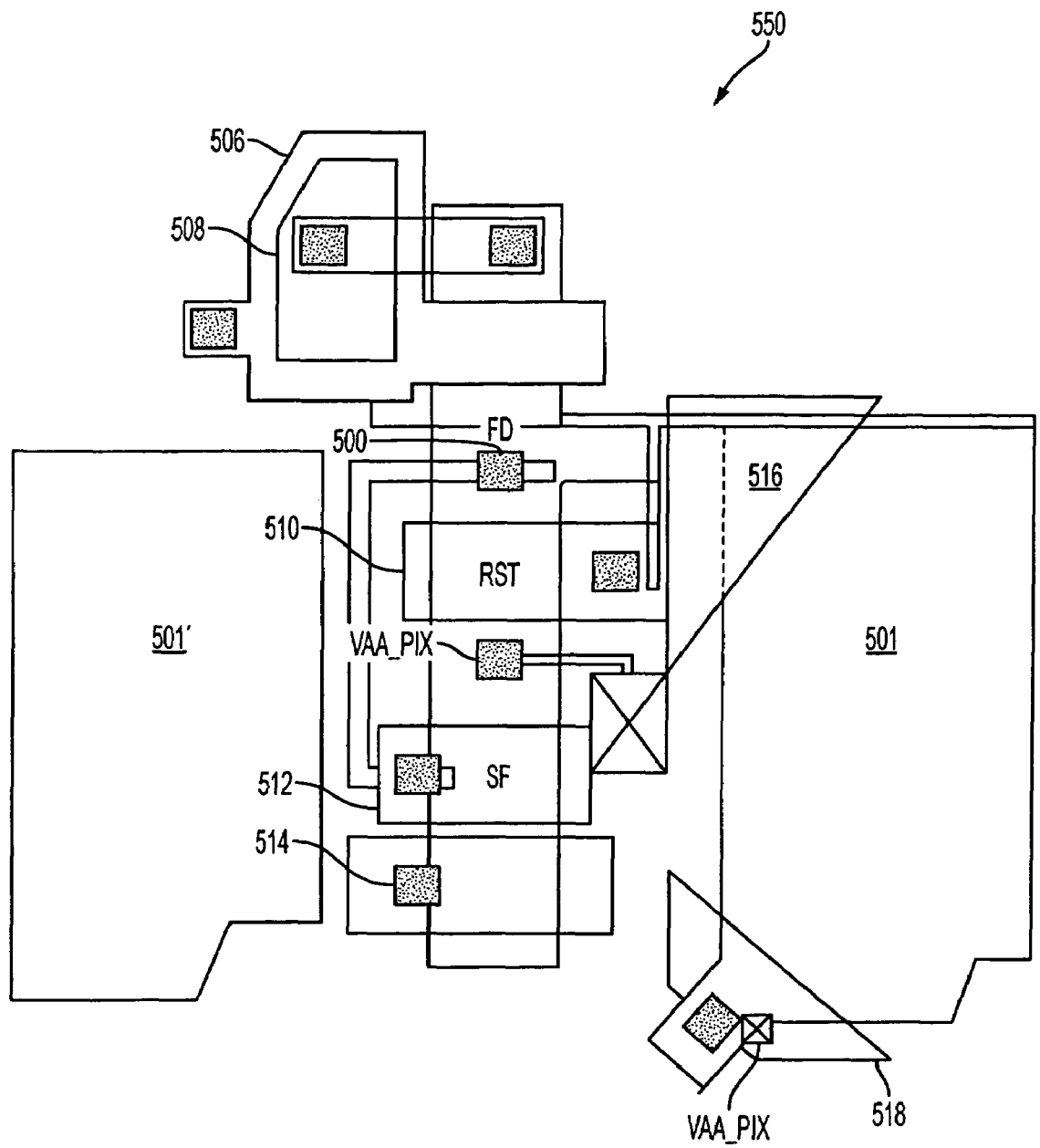
FIG. 6 is a top-down view of a portion of a CMOS pixel cell array constructed in accordance with another exemplary embodiment of the invention.
Figure 7:
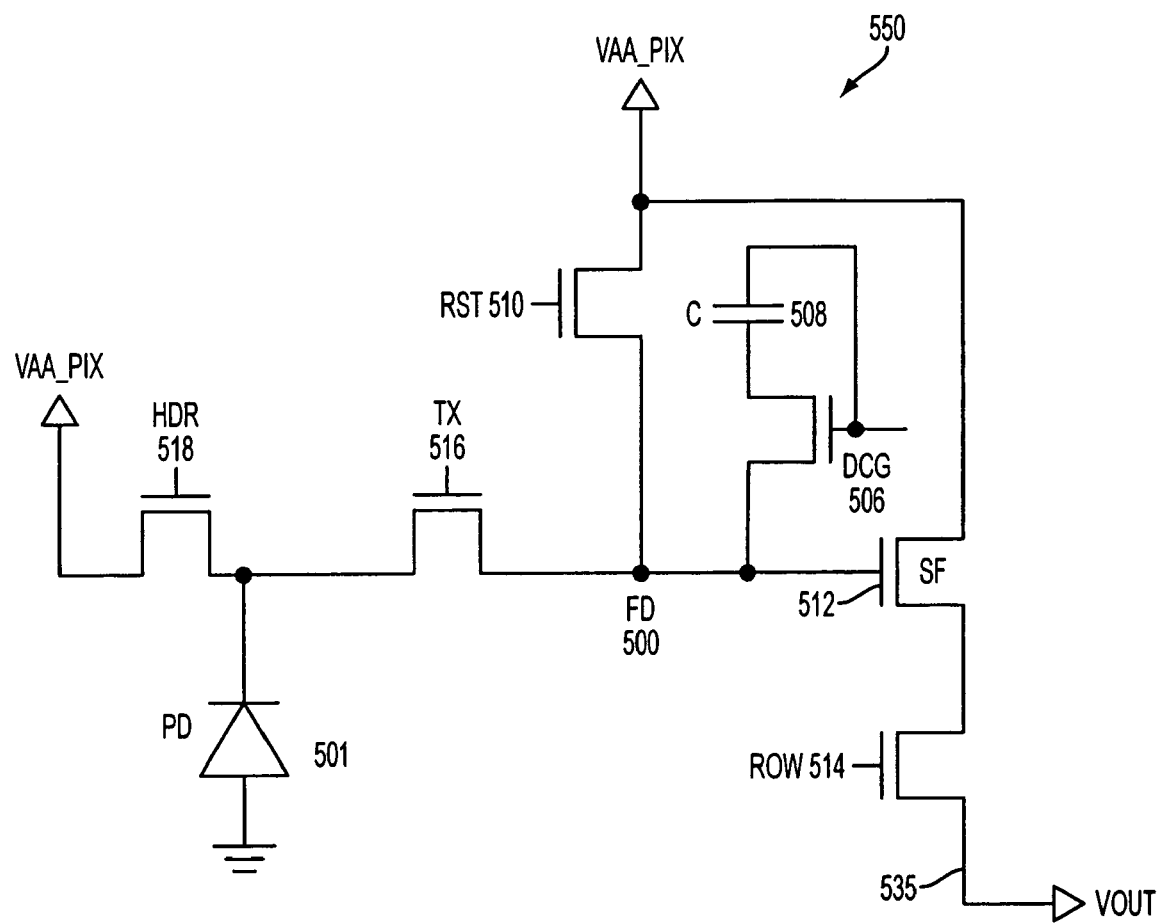
FIG. 7 is a circuit diagram according to another exemplary embodiment of the invention.

In another exemplary embodiment according to the invention, a non-shared pixel cell utilizes the capacitor-DCG combination. FIG. 6 illustrates a top down view of an imager pixel cell 550 according to this embodiment of the invention. FIG. 7 illustrates a circuit diagram for the pixel cell 550 illustrated in FIG. 6. FIGS. 6-7 depict a six transistor trumpet pixel having DCG transistor 506, HDR transistor 518, reset transistor 510, row select transistor 514, transfer transistor 516 and source follower transistor 512. The readout trunk comprising the reset transistor 510, row select transistor 514, and source follower transistor 512 is located laterally to the left of the photosensor 501. The photosensor 501 is connected to the HDR transistor 518 and the transfer transistor 516. The transfer transistor 516 is controllable by a transfer gate control signal TX. When the signal is generated, the transfer transistor 516 transfers the charge collected by the photosensor 501 to the floating diffusion region 500. The gate of the source follower transistor 512 is connected to the floating diffusion region 500. A source/drain terminal of the source follower transistor 512 is connected to the array pixel supply voltage VAA_PIX. The row select transistor 514 is connected between the source follower transistor 512 and a column line 535.

The reset transistor 510 is connected between the floating diffusion region 500 and array pixel supply voltage VAA_PIX. The reset transistor 510 resets the floating diffusion region 500 before charge is transferred by the transfer transistor 516. The DCG transistor 506 is between the floating diffusion region 500 and the capacitor 508. The gate of the DCG transistor 506 functions as the bottom plate of the capacitor 508. The gate of the DCG transistor 506 is connected to receive a dual conversion gain control signal DCG. When the dual conversion gain control signal DCG is generated, the DCG transistor 506 is activated which connects the floating diffusion region 500 to the capacitor 508. As in the prior embodiment, one plate of the capacitor 508 is also the gate of the DCG transistor 506 and receives voltage from the gate control signal for the DCG transistor 506.

Figure 8:
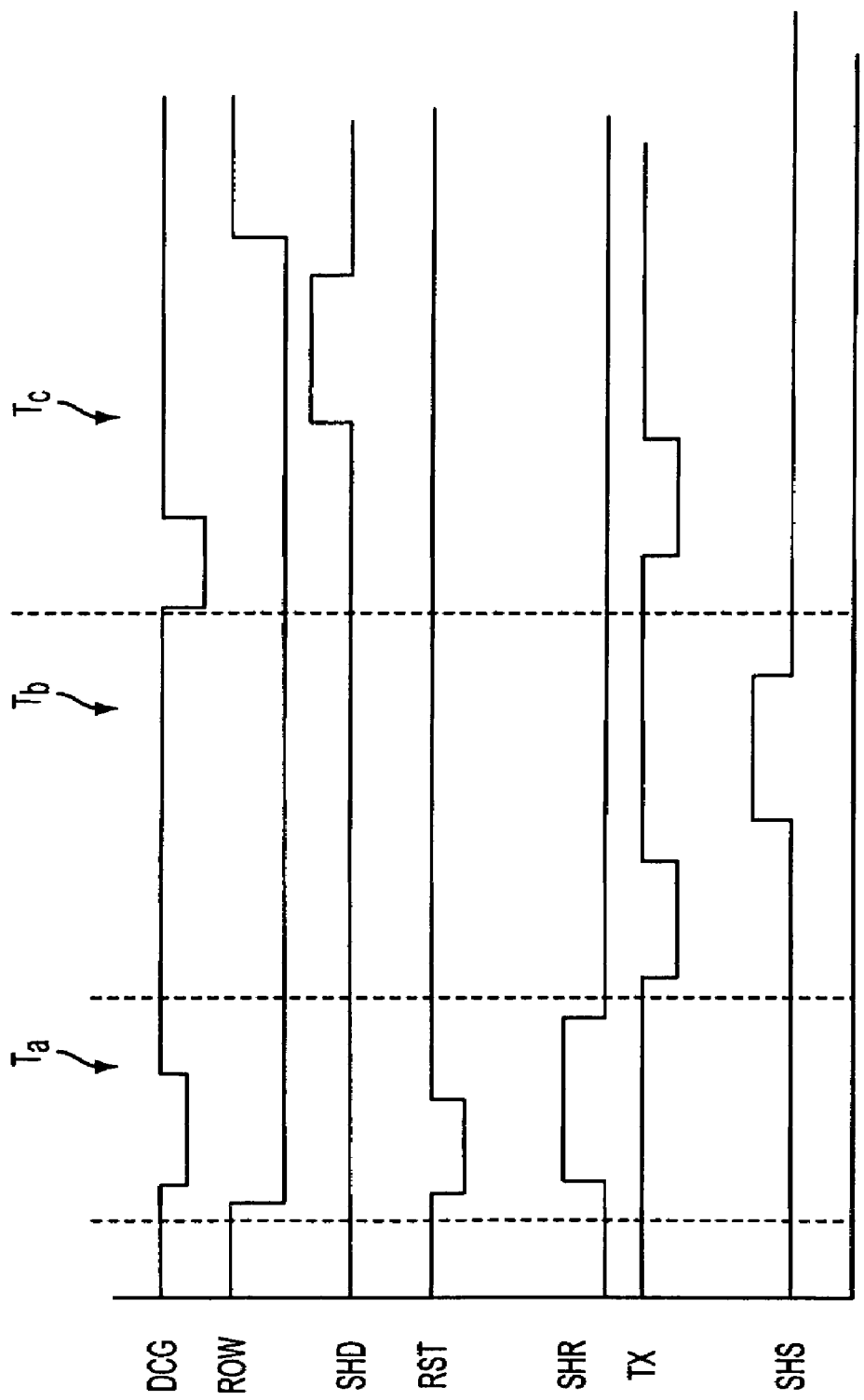
FIG. 8 is a timing diagram of the pixel cell array of FIG. 6 according to another exemplary embodiment of the invention.

FIG. 8 is a timing diagram illustrating an exemplary operation of the pixel cell 550 illustrated in FIGS. 6-7. The timing diagram illustrates three periods $T_a$, $T_b$, $T_c$. During the first time period $T_a$, the row select signal ROW is applied to the gate of the row select transistor 514 (shown as being active low in FIG. 8). It should be appreciated that FIG. 8 is an exemplary timing diagram and that it is immaterial whether a signal is illustrated as being active low or high in FIG. 8. All that is required to practice the invention is for the illustrated control signal to activate the component the signal is controlling.

The floating diffusion region 500 of the pixel cell 550 is reset by asserting the reset control signal RST (shown as being active low in FIG. 8) at the same time. This causes the array pixel supply voltage VAA_PIX to be applied to the floating diffusion region 500 through the reset transistor 510. The reset signal voltage Vrst associated with the reset floating diffusion region 500, as output by the source follower transistor 512 and activated row select transistor 512, is applied to a column line connected to sample and hold circuitry 265 (FIG. 9) and then sampled and held by the pulsing of a reset sample and hold signal SHR (active high).

During the second time period $T_b$, charge accumulating in the photosensor 501 is transferred to the floating diffusion region 500 when the transfer gate control signal TX is asserted (shown as being active low in FIG. 8) and activates the TX transistor 516. The pixel signal voltage Vsig1 associated with the pixel signal charge stored in the floating diffusion region 500, as output by the source follower transistor 512 and activated row select transistor 514, is applied to a column line connected to sample and hold circuitry 265 (FIG. 9) and then sampled and held by the pulsing of a sample and hold pixel signal SHS (active high).

To increase the charge storage capacity of the pixel cell 550, the following operations are performed during the third time period $T_c$. It should be noted that the following third time period $T_c$ operations may be performed for every readout operation or only when needed to avoid the over capacity condition described above, i.e., when a controller or image processor determines that the amount of incident light will result in the floating diffusion region being saturated.

During the third time period $T_c$, the dual conversion gain control signal DCG is applied (shown as being active low in FIG. 8). This causes the DCG transistor 506 to become active, which connects the floating diffusion region 500 to the capacitor 508. The full charge within the floating diffusion region 500 also flows to and is stored in the capacitor 508. The transfer gate control signal is applied (shown as being active low in FIG. 8) to activate the transfer transistor 516. The remaining charge from the photosensor 501 is stored in the floating diffusion region 500. The new pixel signal voltage Vsig2 associated with the pixel signal charge stored in the floating diffusion region 500, as output by the source follower transistor 512 and activated row select transistor 514, is applied to a column line connected to sample and hold circuitry 265 (FIG. 9) and then sampled and held by the pulsing of a third sample and hold pixel signal SHD (active high). The three sampled and held signals may then undergo a correlated sampling operation to obtain the actual pixel signal level (e.g., (Vrst-Vsig1), (Vrst-Vsig2)). As in the first embodiment, both of the signals may be converted to digital signals and sent to the image processor 280, or only one of the two signals may be selected for conversion and sent to the image processor 280.

It should be noted that if an HDR transistor 518 is used in the pixel circuit 550, then the high dynamic range control signal HDR would be applied throughout all three time periods $T_a$, $T_b$, $T_c$ to ensure that the HDR transistor 518 remains active during the charge integration operations. This photosensor prevents blooming from occurring.

The pixel structures described above may be formed in a substrate using known methods of transistor fabrication to form the transistors as described herein in the embodied layouts illustrated in FIGS. 3 and 6. The photosensors 401a, 401b, 401c, 401d, 501 can be formed as any suitable photosensitive structure for converting light photons into electrons (photo-charges). In a preferred embodiment, the photosensors 401a, 401b, 401c, 401d, 501 are pinned photodiodes, however, they may be formed as photogates, Schottky diodes, or as another photo-sensing devices compatible with the invention.

Figure 9:
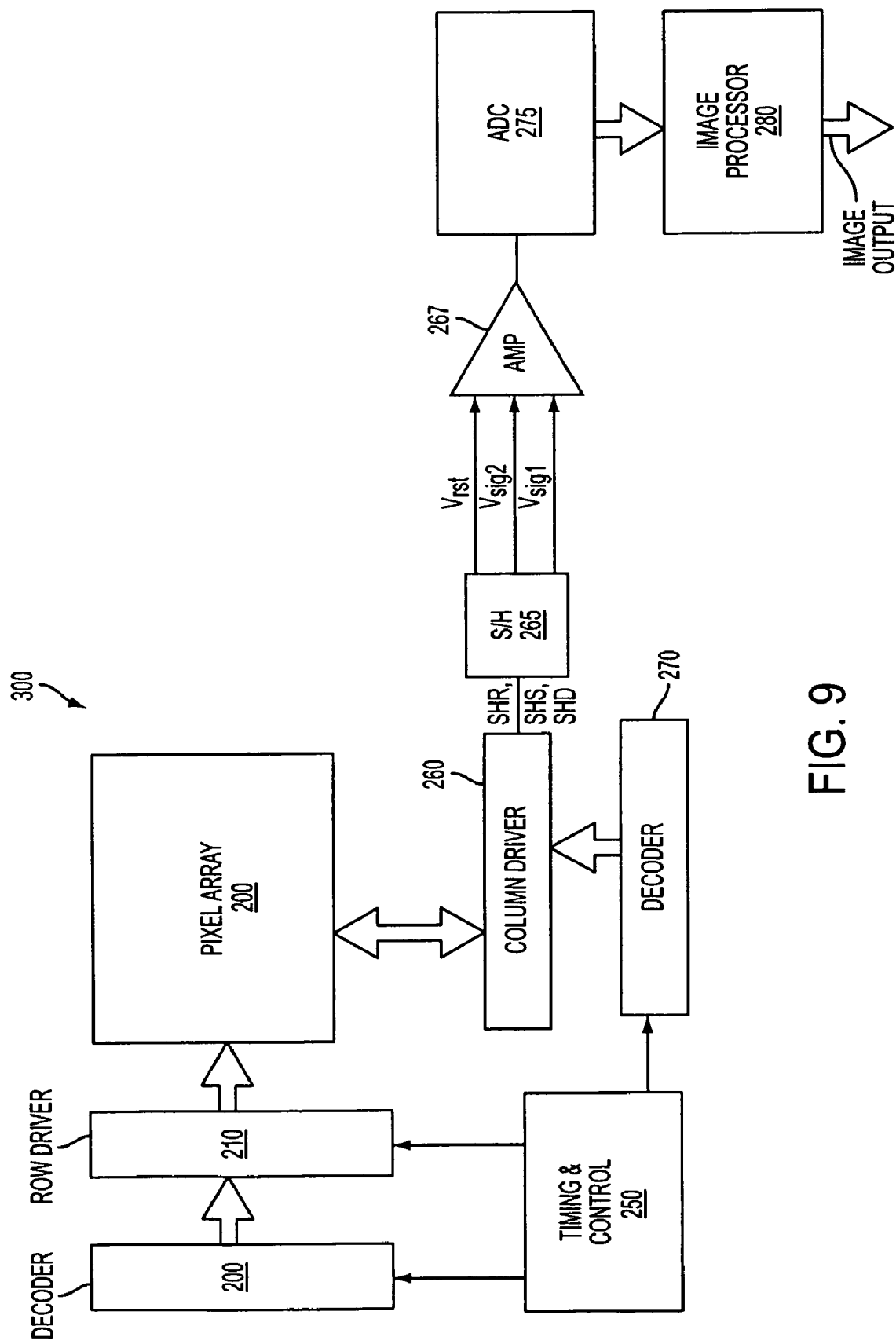
FIG. 9 is a block diagram of a CMOS imager chip having an array of pixel cells constructed in accordance with the invention.

FIG. 9 illustrates a block diagram of an exemplary CMOS imager 300 having a pixel array 200 formed of pixel cells constructed in accordance with the combined dual conversion gain transistor and capacitor embodiments described above (i.e., pixels 450a, 450b, 450c, 450d (FIG. 3), pixel 550 (FIG. 6)). Pixel array 200 comprises a plurality of pixel cells arranged in a predetermined number of columns and rows (not shown). Attached to the array 200 is signal processing circuitry, as described herein. The pixel cells of each row in array 200 can be simultaneously operated, and the pixel cells of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel cell.

The CMOS imager 300 is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal (Vrst), and the pixel image signals (Vsig1, Vsig2) are read by a sample and hold circuit 265 associated with the column drive 260. A signal is produced by amplifier 267 for each pixel. The signal is digitized by an analog-to-digital converter 275 (ADC). The analog-to-digital converter 275 supplies the digitized pixel signals to an image processor 280 which forms and outputs a digital image.

Figure 10:
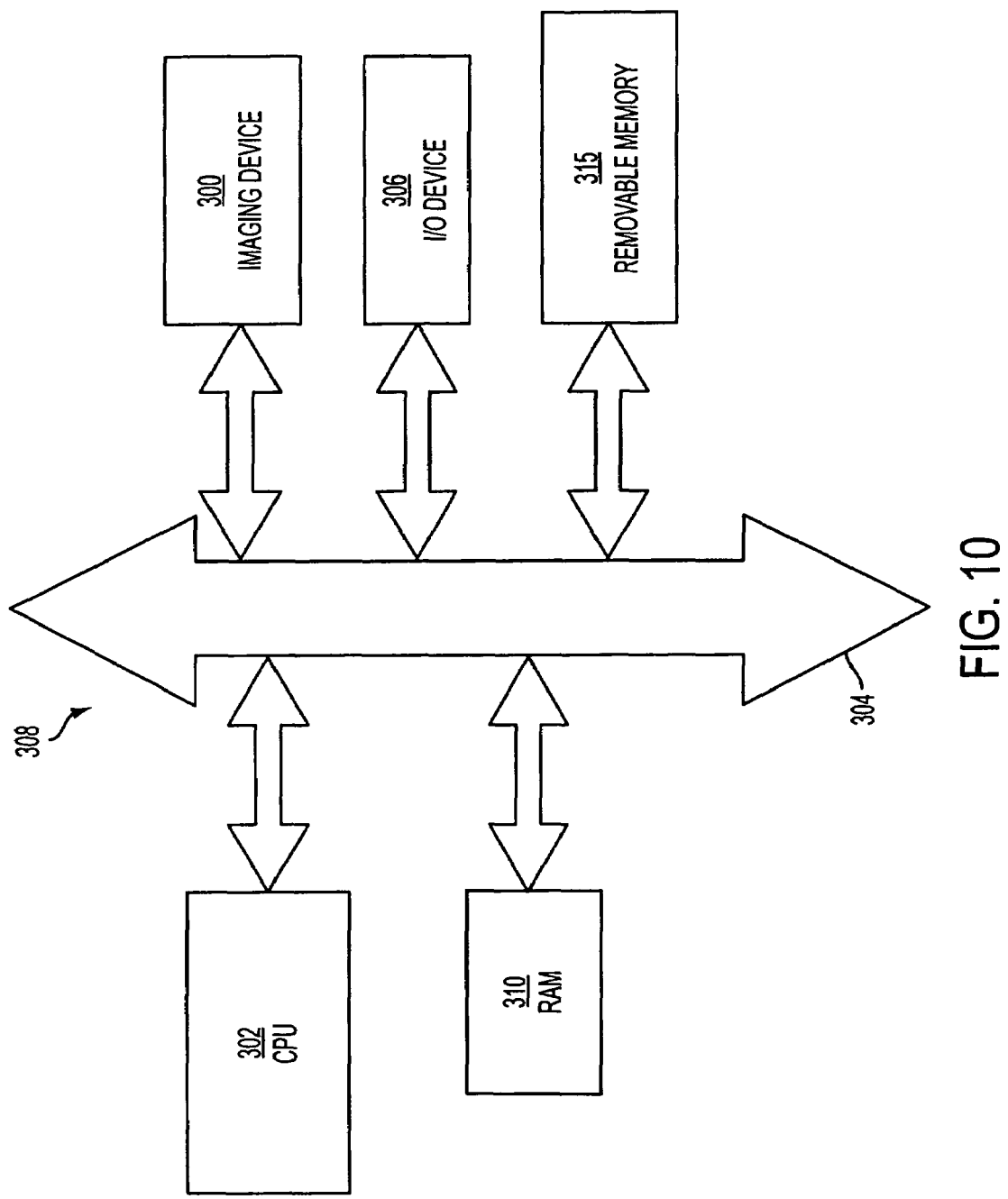
FIG. 10 is a schematic diagram of a processing system employing a CMOS imager constructed in accordance with the invention.

FIG. 10 shows a processor system 308, which includes an imager 300 constructed in accordance with an embodiment of the invention. The processor system 308 may be part of a digital camera or other imaging system. The imager 300 may receive control or other data from system 308. System 308 includes a processor 302 having a central processing unit (CPU) for image processing, or other image handling operations. The processor 302 communicates with various devices over a bus 304. Some of the devices connected to the bus 304 provide communication into and out of the system 308; an input/output (I/O) device 306 and an imaging device, i.e., imager 300, are such communication devices. Other devices connected to the bus 304 provide memory, for instance, a random access memory (RAM) 310 or a removable memory 315.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification of the present invention that comes within the spirit and scope of the following claims should be considered part of the present invention.

What is claimed as new and desired to be protected by Letters Patent of the United States is:

1. A method of operating an imager device comprising:
    resetting a diffusion region;
    storing photo-generated charge in the diffusion region;
    activating a dual conversion gain transistor gate which is an electrode of a capacitor, the other electrode which is connected to the dual conversion gain transistor; and
    storing photo-generated charge in the capacitor of said dual conversion gain transistor capacitor combination circuit.

2. The method of claim 1 further comprising:
    outputting a first signal representing the reset diffusion region;
    outputting a second signal representing the stored photo-generated charge; and
    outputting a third signal representing the stored additional charge.

3. The method of claim 2 further comprising:
    sampling and holding the first, second and third signals; and
    using the sampled and held first, second and third signals to obtain a correlated output value.

4. The method of claim 1, further comprising the act of draining excess charge away from a photosensitive device.

5. The method of claim 1, wherein said act of storing photo-generated charge comprises the act of transferring the charge from a photosensitive element to the first diffusion region via a transfer element.

6. The method according to claim 1, wherein the act of storing photo-generated charge in the capacitor further comprises:
    determining if the stored photo-generated charge exceeds a predetermined level; and
    if the stored photo-generated charge exceeds the predetermined level, activating the dual conversion gain transistor of the dual conversion gain transistor capacitor combination circuit and storing the transferred stored photo-generated charge in the capacitor.

7. A method of fabricating imaging device comprising:
    providing a first photosensitive element;
    providing a first transfer transistor coupled between the first photosensitive element and a diffusion region, said first transfer transistor for transferring photo-generated charge from the first photosensitive element to said diffusion region; and providing a dual conversion gain transistor coupled between the diffusion region and a capacitor, said dual conversion gain element for connecting said diffusion region to the capacitor when activated, wherein the gate of said dual conversion gain transistor is a plate of said capacitor.

8. The method claim 7, further comprising providing a reset element coupled between a reset voltage and the diffusion region.

9. The method of claim 7, further comprising providing a high dynamic range element coupled between a voltage source and the first photosensitive element.

10. The method of claim 7, further comprising:

providing a second photosensitive element; and providing a second transfer transistor coupled between the second photosensitive element and said diffusion region.

11. The method of claim 10, further comprising providing a third photosensitive element;

providing a third transfer transistor coupled between the third photosensitive element and said diffusion region;

providing a fourth photosensitive element; and providing a fourth transfer transistor coupled between the fourth photosensitive element and said diffusion region.

* * * * *

UNITED STATES PATENT AND TRADEMARK OFFICE
CERTIFICATE OF CORRECTION

| | | |
|---|---|---|
| PATENT NO. | : 7,683,306 B2 | Page 1 of 1 |
| APPLICATION NO. | : 12/230014 | |
| DATED | : March 23, 2010 | |
| INVENTOR(S) | : Jeffrey A. Mckee | |

It is certified that error appears in the above-identified patent and that said Letters Patent is hereby corrected as shown below:

In column 11, line 10, in Claim 8, delete "method" and insert -- method of --, therefor.

Signed and Sealed this

First Day of June, 2010

David J. Kappos
*Director of the United States Patent and Trademark Office*